United States Patent [19]

Higgins, III

[11] Patent Number: 5,378,981

[45] Date of Patent: Jan. 3, 1995

[54] METHOD FOR TESTING A SEMICONDUCTOR DEVICE ON A UNIVERSAL TEST CIRCUIT SUBSTRATE

[75] Inventor: Leo M. Higgins, III, Austin, Tex.

[73] Assignee: Motorola, Inc., Schaumburg, Ill.

[21] Appl. No.: 12,193

[22] Filed: Feb. 2, 1993

[51] Int. Cl.⁶ .................. G01R 31/02; H01R 9/00
[52] U.S. Cl. .................. 324/765; 324/158.1; 361/772
[58] Field of Search .............. 324/158 R, 158 F; 437/8; 257/668, 670, 689; 361/772, 774

[56] References Cited

U.S. PATENT DOCUMENTS

| | | | |
|---|---|---|---|
| 5,002,895 | 3/1991 | LeParquier et al. | 437/8 |
| 5,025,212 | 6/1991 | Gloanec et al. | 324/158 F |
| 5,061,988 | 10/1991 | Rector | 357/74 |
| 5,121,053 | 6/1992 | Shreeve et al. | 324/158 F |

*Primary Examiner*—Ernest F. Karlsen
*Attorney, Agent, or Firm*—Minh-Hien N. Clark

[57] ABSTRACT

A low cost method is used to standardize testing of bare semiconductor devices. In one embodiment, a universal test circuit substrate (10) having an interleaving fan-out pattern of conductive traces (14) is provided. The radial array of conductive traces terminates in a plurality of test pads (16) placed in a standard pattern around a periphery of a central die accommodating region. A die cavity (36), slightly larger than the size of a semiconductor die (32) to be tested, is formed in the central die accommodating region. The semiconductor die is placed approximately centered in the die cavity and is wire bonded (40) to individual traces of the pattern of conductive traces. The die can be tested and burned-in on the universal test circuit substrate with a test probe making contact with the test pads. The universal test circuit substrate can accommodate a multiplicity of die sizes and pin-out requirements of semiconductor devices.

18 Claims, 3 Drawing Sheets

METHOD FOR TESTING A SEMICONDUCTOR DEVICE ON A UNIVERSAL TEST CIRCUIT SUBSTRATE

FIELD OF THE INVENTION

This invention relates to a method for testing semiconductor devices in general, and more specifically to a method for testing a semiconductor device using a universal test circuit substrate.

BACKGROUND OF THE INVENTION

It is desirable to test and burn-in semiconductor devices before they are assembled onto multichip modules, or in some cases into single chip packages. Traditionally, all semiconductor dice are probed individually before assembly, while critical devices are burned in under accelerated aging conditions after packaging to minimize the risk of subsequent system failure. Burn-in is performed to screen out weak devices, and packaged devices rather than bare semiconductor dice are normally burned-in due to the technical and economic challenges of bare die burn-in. Most burn-in failures are device or die related due to weak gate oxide. Burn-in of devices used on multichip modules is typically performed at the assembled module level. The drawback in module level burn-in is that a percentage of the dice in the module will often fail. If a die fails in a multichip module, either that module has to be repaired by replacing the failed die with another good die, or that module must be rejected and discarded. Typically neither option is cost effective.

It is possible to mount a bare semiconductor die to a test circuit substrate, electrically connect the semiconductor die to the test circuit substrate, and perform testing of the die on the test circuit substrate by contacting test pads on the test circuit substrate. However, semiconductor dice are fabricated in a multiplicity of die sizes depending on the functions of the dice. Therefore, a different test circuit substrate is usually necessary for each different size of semiconductor die. Moreover, different semiconductor dice require dissimilar pin outs which means that a customized interconnect test pattern must be generated on the test circuit substrate for each type of semiconductor die.

U.S. Pat. No. 5,002,895 by LeParquier et al. teaches mounting of a semiconductor die on a test frame. The die is then wire bonded to the frame and tested on the frame via test pads on the frame. After testing, the die and the frame are placed on a substrate. The wire bonds used to connect the die to the frame to enable testing are used to connect the die to the substrate by a welding method. The wires are cut after soldering to remove the frame from the semiconductor that has been mounted to the substrate. The disadvantage to this method is that the frame is customized for each size of semiconductor die, so that a multiplicity of frames are needed to test a variety of semiconductor die sizes.

It is desirable to test and burn-in semiconductor dice before they are assembled in a multichip module to ensure that only functional dice are used so as to eliminate rework and rejects. It is also desirable to have a generic or universal test circuit substrate for use with any size of semiconductor dice regardless of the pin-out requirements of a specific die.

SUMMARY OF THE INVENTION

This invention provides a method for testing a semiconductor device using a universal test circuit substrate. In accordance with the invention, a universal test circuit substrate is provided. The universal test circuit substrate has an insulating layer of electrically nonconductive material having a surface, an interleaving fan-out pattern of conductive traces on the surface of the insulating layer, and a central die accommodating region. The interleaving fan-out pattern of conductive traces terminates in a plurality of test pads in a standard pattern. A semiconductor die is provided. The semiconductor die is placed in the central die accommodating region of the universal test circuit substrate. The semiconductor die is wire bonded to the interleaving fan-out pattern of conductive traces to provide electrical connections. The semiconductor die can then be tested via the plurality of test pads.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

Figure 1:
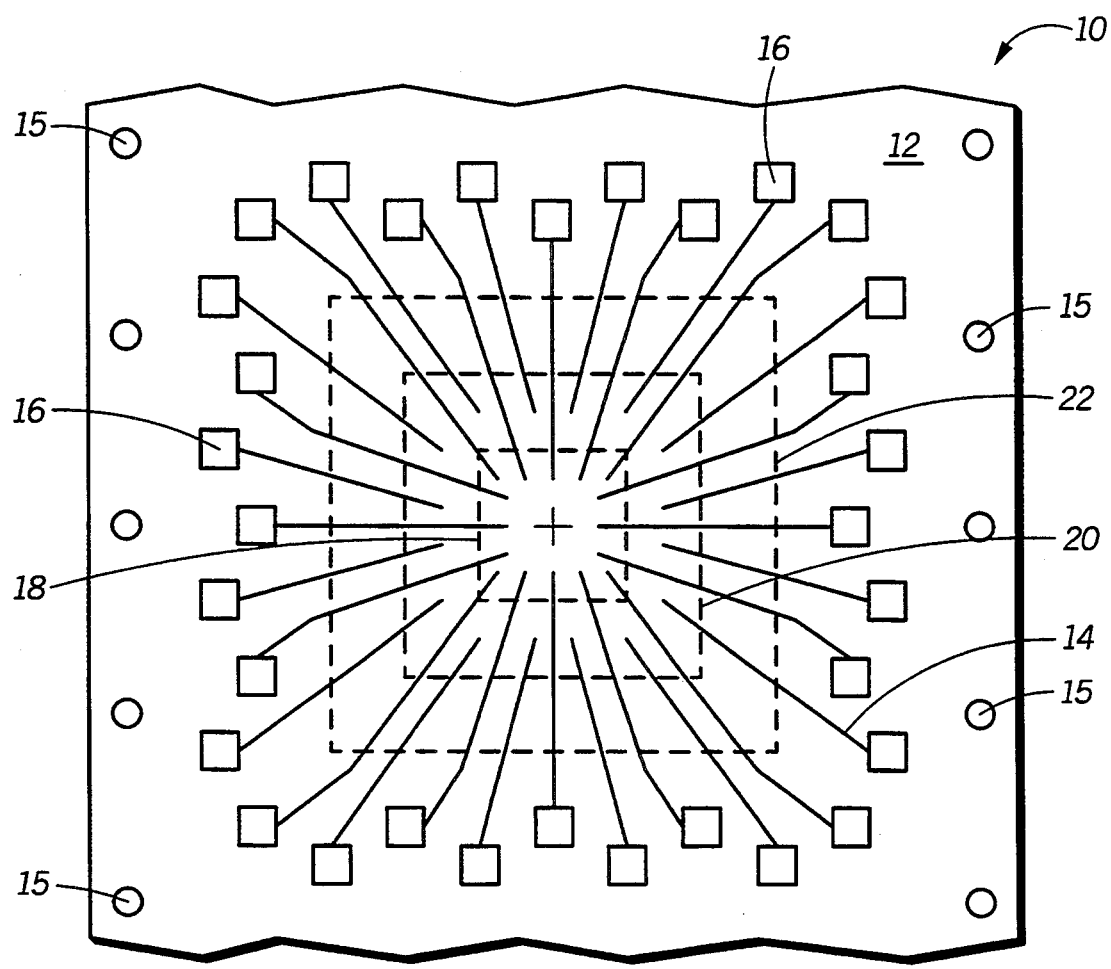
FIG. 1 illustrates, in a top view, a universal test circuit substrate in accordance with the invention.

The invention is now discussed in detail with reference to the figures. FIG. 1 illustrates, in a top view, a universal test circuit substrate 10 in accordance with the invention. Universal test circuit substrate 10 is preferably a flexible circuit, similar to a tape automated bonding (TAB) component. In a preferred form, universal test circuit substrate 10 is a continuous tape composed of an insulating layer of electrically nonconductive material 12 with a series of interleaving fan-out patterns of conductive traces 14 along a length of the tape. Although not limited to these following materials, examples of possible materials that can be used for the universal test circuit substrate are conductor patterned polymer film, such as aluminum on polyester film, copper on polyester film, aluminum on polyimide film, copper on polyimide film. Further examples include conductor patterned reinforced polymer film, such as copper on epoxy-glass, aluminum on epoxy-glass, copper on phenolic-paper, aluminum on phenolic paper, copper on polyimide-glass, and aluminum on polyimide-glass. Other materials may also be possible. The universal test circuit substrate 10 has in the vicinity of its edges, a plurality of positioning or tooling holes 15 and registration holes (not illustrated).

Figure 2:
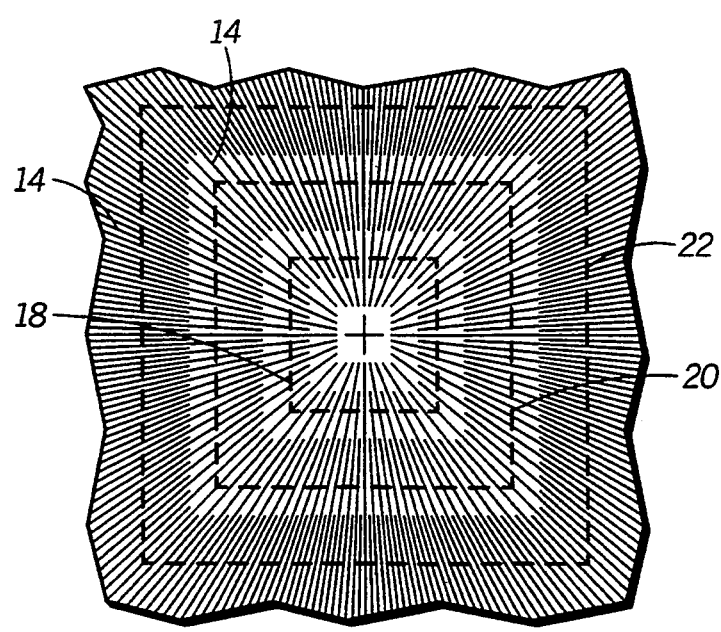
FIG. 2 illustrates, in a top view, a portion of the universal test circuit substrate of FIG. 1 to depict an interleaving fan-out pattern of conductive traces.

FIG. 1 illustrates only one of the interleaving fan-out patterns of conductive traces 14 on universal test circuit substrate 10, although it should be understood that this pattern is repeated along the length of the tape. The interleaving fan-out pattern of conductive traces 14 has a central die accommodating region, wherein the conductive traces 14 extend radially outward from the central die accommodating region. An IC component such as a semiconductor die to be tested and/or burned-in is placed in each of these central die accommodating regions. The interleaving fan-out pattern of conductive traces 14 is illustrated with a representative radial pattern showing a only limited number of traces for clarity. However, an actual pattern will have more traces, an example of which is illustrated in FIG. 2. As can be seen in FIG. 2, the spacing between each trace increases as the conductive traces extend radially outward so that additional traces can be interleaved between the traces.

As illustrated in FIG. 1, the universal test circuit substrate 10 has the interleaving fan-out pattern of conductive traces 14 on a primary surface of the insulating layer of electrically nonconductive material 12. The conductive traces are typically formed from etched copper. However, other methods employing metal deposition techniques, may also be used to form the pattern of conductive traces. The conductive traces may also be aluminum. The conductive traces are typically coated with metal films to improve wire bondability and to minimize oxidation or corrosion. A typical coating may consist of a layer of nickel and/or gold over the conductive traces. The interleaving fan-out pattern of conductive traces 14 terminates in a plurality of test pads 16 placed in a standard pattern around the periphery of the central die accommodating region. The test pads are placed in a standard pattern so that a generic test socket can be used. There may be many more test pads than are necessary for the pin-out requirement of a specific semiconductor die. In this manner, components ranging from semiconductor dice that require only a few pin-outs, to semiconductor dice requiring a large number of pin-outs, can be mounted and tested on the same test circuit substrate; hence the term "universal test circuit substrate" is used in conjunction with the invention. Often, larger semiconductor dice, especially those utilizing random logic, have increasingly higher pin counts. The perimeter of the larger die will overlay increasingly higher numbers of conductive traces on the universal test circuit substrate, permitting wire bond attachment to the increasing bond pads of the die. By having a universal test circuit substrate, significant cost savings can be realized from not requiring customized TAB tape artwork for each different semiconductor die.

Additionally illustrated in FIG. 1 is a plurality of excise regions 18, 20, and 22 on the universal circuit substrate 10. Although FIG. 1 illustrates three excise regions, it is obvious that the universal test circuit substrate 10 may have more or less excise regions depending on the need of a user. Moreover, the shape of the excise region is not limited to a square as illustrated in FIG. 1, but can vary to be rectangular, round, oval, or any other desired shape. The plurality of excise regions 18, 20, and 22 are designed to accommodate a multiplicity of die sizes and bond pad counts. Each of the excise regions can accommodate a semiconductor die having a size that is smaller than the excise region so that there is a clearance between the edges of the die and the edges of the excised area.

Figure 3:
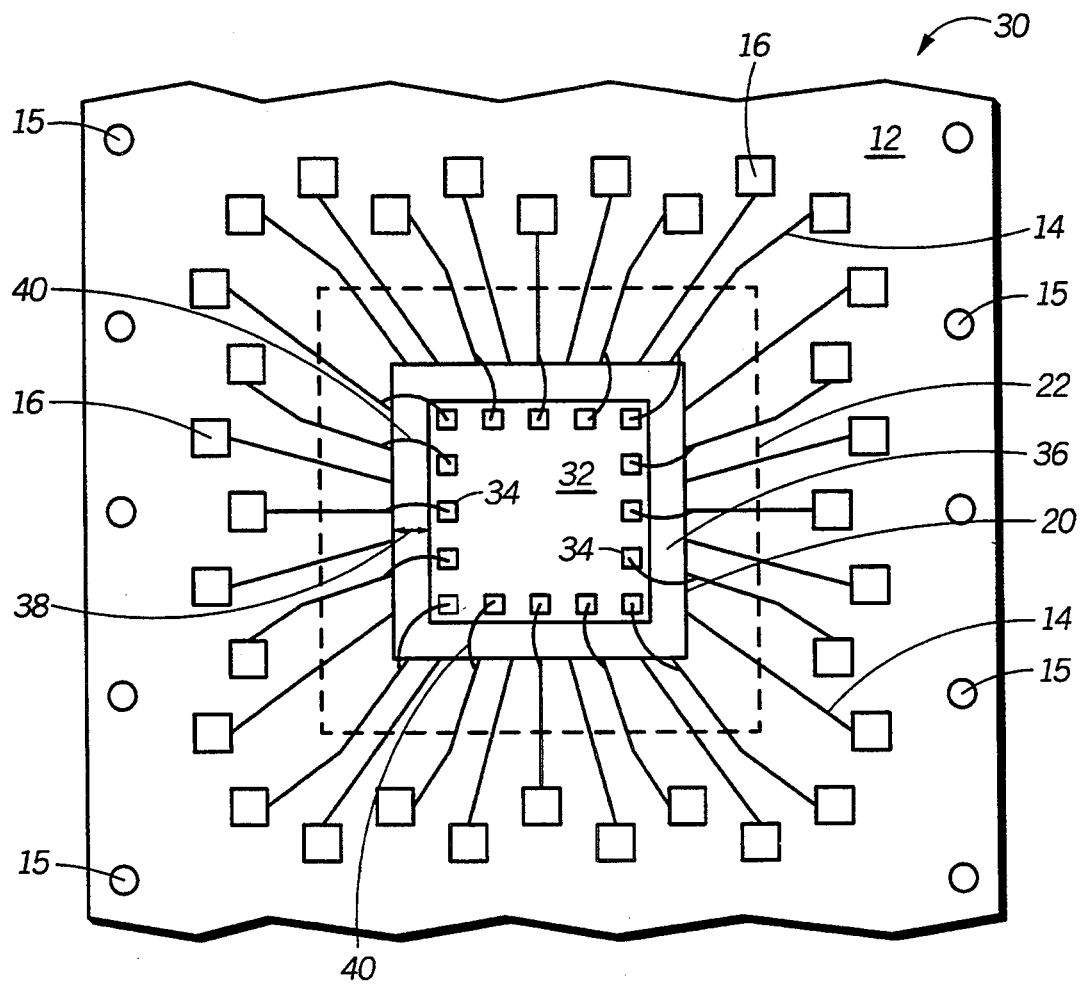
FIG. 3 illustrates, in a top view, a semiconductor die wire bonded to the universal test circuit substrate of FIG. 1 in accordance with one method of the invention.

Illustrated in FIG. 3 is a top view of a testable semiconductor assembly 30 in accordance with one method of practicing the invention. A semiconductor die 32 having a plurality of bonding pads 34 is provided. The semiconductor die 32 can be of any size that fits within the peripheral test pads 16 and allows electrical connections between the die 32 and the pattern of conductive traces 14. A die cavity 36 is punched into the universal test circuit substrate 10. This can be accomplished with a mechanical punch tool, a laser, or any other suitable method, such as etching. The semiconductor die 32 is illustrated in FIG. 3 to be of a size that is slightly smaller than excise region 20 on the universal test circuit substrate 10. Therefore, there is a clearance 38 between the edges of the die 32 and the edges of the die cavity 36. A clearance of approximately 1.25 millimeters in each direction is suggested, although this clearance value can vary. Only one punch tool is needed for each unique semiconductor die size, regardless of pin-out requirements of a specific die. It is also possible that a single punch tool would be suitable for a number of die sizes if the sizes were similar enough so that variances in clearance 38 did not become critical. It should be noted that the die cavity 36 can be of a different size depending on the size of the semiconductor die 32.

The use of a customized substrate for each semiconductor die, or small family of dice, along with custom interconnect artwork for each die or small family of dice requires the use of punch tooling. This embodiment of the present invention also requires a cavity tooling process but avoids the cost of expensive custom interconnect artwork. Punch tooling and laser processing for cavity processing is inexpensive and represents a desirable alternative to the use of fully customized substrates for each semiconductor die or small family of dice.

Once the die cavity 36 is formed in the universal test circuit substrate 10, the substrate is centered about the semiconductor die 32 on a wire bonding machine (not illustrated). A plurality of wire bonds 40 are made between individual traces of the interleaving fan-out pattern of conductive traces 14 and associated bonding pads 34 on the semiconductor die 32. In a preferred method, wire bonding is performed with a first bond on the bonding pad 34 on the semiconductor die 32 and a second bond on the conductive trace 14. Techniques of wire bonding are well known in the art. In the case of gold or gold alloy wires, thermosonic wire bonding and thermocompression wire bonding techniques are used. In the case of aluminum or aluminum alloy wires, an ultrasonic wire bonding technique is used. Other methods of wire bonding may also be possible. Thus, any type of wire that is compatible with thermosonic, ultrasonic, thermocompression, or any other wire bonding may also be used.

Once the semiconductor die 32 is wire bonded to the conductive traces 14, the semiconductor assembly 30 may be introduced to a test fixture which will make electrical contact with the test pads 16 located at the periphery of the central die accommodating region on the universal test circuit substrate 10. After successful testing and burn-in of the semiconductor die 32, the die 32 along with the universal test circuit substrate 10 is removed from the test fixture. The known good die may then be excised from the substrate and placed in a multichip module or another suitable package configuration.

Figure 4:
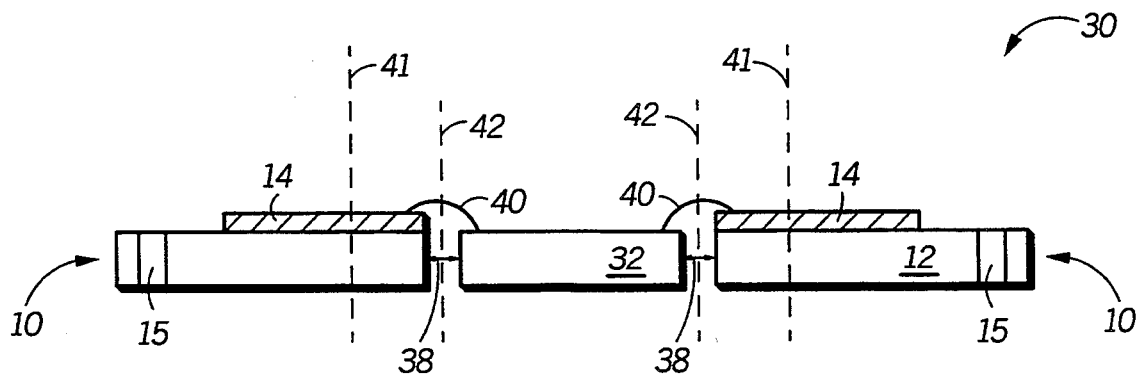
FIG. 4 illustrates a cross-sectional view of FIG. 3.

Illustrated in FIG. 4 is a cross-sectional view of the semiconductor assembly 30 of FIG. 3. As illustrated, semiconductor die 32 fits inside die cavity 36 with an edge clearance 38. The wire bonds 40 span the clearance 38 to connect conductive traces 14 of the universal test circuit substrate 10 to individual bonding pads 34 on die 32. Although semiconductor die 32 is depicted to be in a same plane as the bottom surface of the universal test circuit substrate 10, it should be obvious that die 32 can also be positioned above or below the plane of the bottom surface of substrate 10. In excising the known good die after test and burn-in, the excised die element can include a portion of the substrate to provide a handling and support structure for the semiconductor die, corresponding to dotted line 41 on FIG. 4. Alternatively, the excised die element can include only the tested semiconductor die, wherein the plurality of wire bonds are cut to allow removal of the die from the substrate, corresponding to dotted line 42. In this instance, the wires can be removed from the universal test circuit substrate to permit reuse of the substrate.

Figure 5:
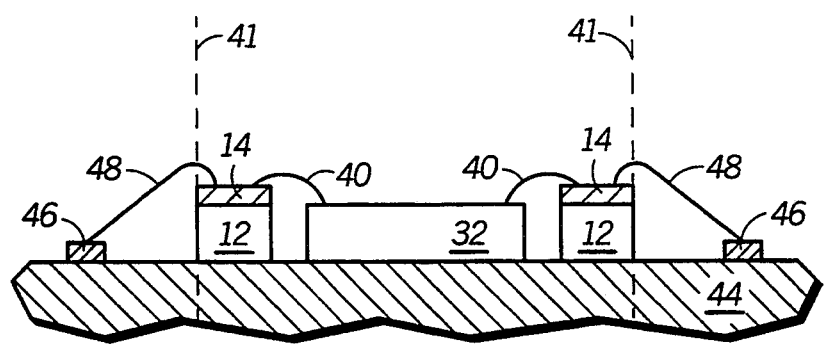
FIG. 5 illustrates, in a cross-sectional view, a method of mounting a tested die to a substrate after excising from the universal test circuit substrate.
Figure 6:
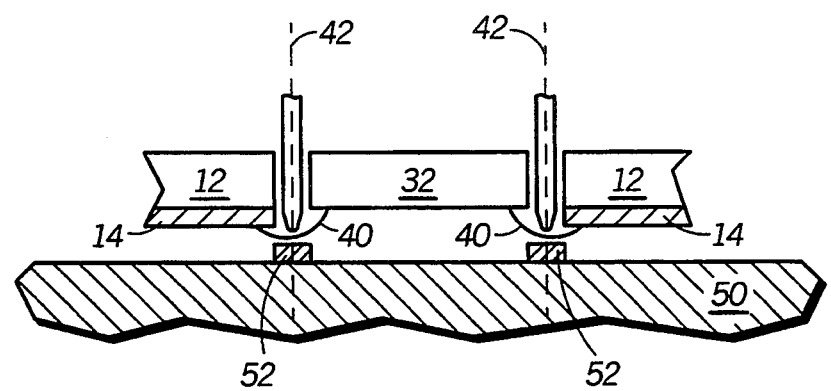
FIG. 6 illustrates, in a cross-sectional view, an alternate method of mounting a tested die to a substrate.

FIGS. 5 & 6 illustrate two ways in which a tested die can be mounted to a substrate. The substrate can be a printed circuit board, a multichip module substrate, or the support base for a single package configuration. In FIG. 5, the die element excised along line 41 is mounted to a substrate 44. Substrate 44 has a plurality of conductive contacts 46 to which the excised die element is wire bonded. Wire bonds 48 electrically connect individual traces of conductive trace pattern 16 to the conductive contacts 46. A plurality of these excised die elements may be mounted onto a substrate, although only one is shown in this illustration. Methods of wire bonding are well known in the art.

FIG. 6 illustrates, in cross-section, an alternative method to mount a tested die onto a substrate. In this method, the semiconductor assembly 30 of FIG. 4 is inverted over a substrate 50. Substrate 50 has a plurality of conductive contacts 52. A secondary wire bonding operation may be performed, wherein a wedge tool of a wire bonder is brought down on wire bond 40 to sever the original wire and form a new wedge bond between the wire and the conductive pad 52. This method may be performed as a single point bonding operation or in a gang bonding step. In this manner, the semiconductor die 32 is completely removed from the universal test circuit substrate 10 once all the new wire bond connections are made. It should be noted that although FIG. 6 illustrates an inverted die, it may also be possible to mount the die upright on the substrate. It may also be desirable to attach a heat sink to the exposed backside of the inverted die once it is mounted on the substrate to provide a low thermal resistance heat flow path.

The remaining figures which illustrate other methods of practicing the present invention incorporate many of the same or similar elements as those described above in reference to the testable semiconductor assembly 30. Therefore, like reference numerals designate identical or corresponding parts in the following figures.

Figure 7:
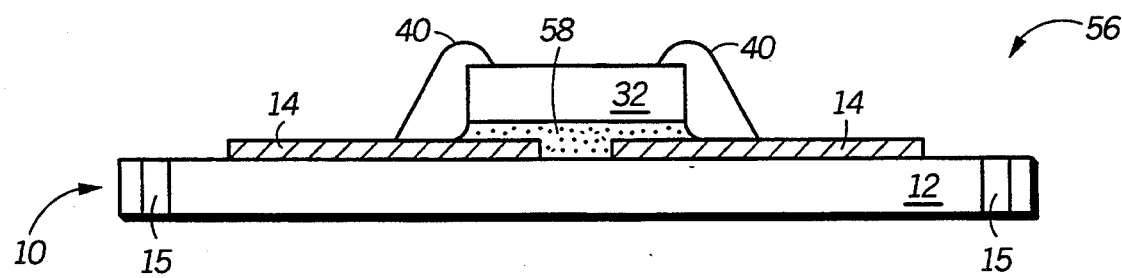
FIG. 7 illustrates, in a cross-sectional view, a semiconductor die mounted directly on the universal test circuit substrate of FIG. 1 and wire bonded thereto in accordance with an alternate method of the invention.

FIG. 7 illustrates, in a cross-sectional view, an alternative testable semiconductor assembly 56 in which a different method of mounting a semiconductor die 32 on a universal test circuit substrate 10, so that the semiconductor die 32 can be tested and burned-in on the universal test circuit substrate 10, is used. Instead of excising a portion of the substrate to form a die cavity in the central die accommodating region, the semiconductor die 32 is mounted directly onto the substrate 10 in the central die accommodating region using an electrically insulative adhesive 58. In some instances, it may be desirable to electrically contact the inactive side of the die. This may be accomplished by selective placement of a quantity of electrically conductive adhesive onto an appropriate conductive feature in the central die accommodating region. Subsequently, insulative adhesive would be applied to prevent the die from shorting to the conductive traces 14. After mounting the semiconductor die in the central die accommodating region, wire bonds 40 are formed between bonding pads on the die to individual traces on the substrate. The assembly can then be tested in a test fixture in the same manner as that previously discussed for FIG. 3.

While the method of FIG. 7 does not require a punching operation to form a die cavity, as was discussed for FIG. 3, some form of cutting operation is required to free the die, wires, and underlying substrate segment from the overall universal test circuit substrate itself. This excised segment can then be wire bonded to an appropriate package configuration or multichip module. Reuse of the universal test circuit substrate is generally not possible in this instance, unless the resulting cavity in the substrate can accommodate another semiconductor die using the method discussed in FIG. 3. In the case of FIG. 3, the die and wires can be completely removed from the substrate by cutting the wire bonds and then removing the remaining wires from the universal test circuit substrate for subsequent reuse.

Figure 8:
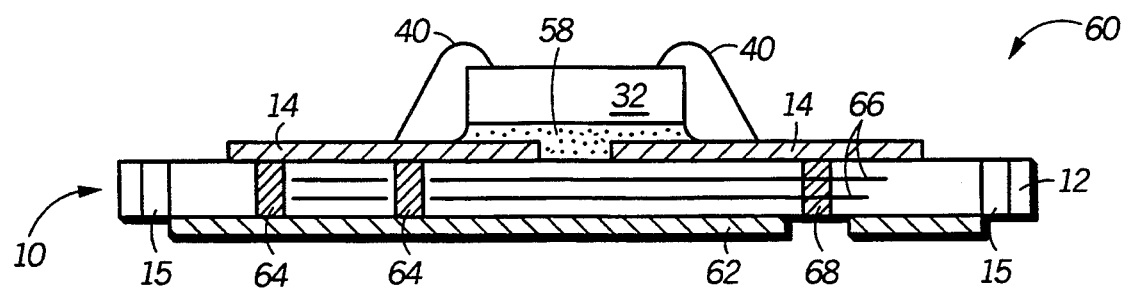
FIG. 8 illustrates, in a cross-sectional view, an alternative universal test circuit substrate with a semiconductor die mounted thereon, in accordance with an alternate method of the invention.

FIG. 8 illustrates, in a cross-section view, another testable semiconductor assembly 60 on an alternative universal test circuit substrate. A second conductor plane 62 is formed on the surface of the universal test circuit substrate which opposes the primary surface to which the semiconductor die 32 is mounted. This second conductor plane 62 could be connected to a reference voltage level in a test connector or circuitry to provide a shield to reduce cross-talk and provide a more desirable controlled impedance for the interleaving fan-out pattern of conductive traces 14 to which the die 32 is bonded. The conductor plane 62 could be electrically connected to some or all of the individual traces of the fan-out pattern which possess the same voltage through the use of plated through-holes 64 or other appropriate methods. FIG. 8 also illustrates added internal planes 66 and plated through-hole 68 which may be desired in some instances to provide for improved signal integrity or for other purposes.

The foregoing description and illustrations contained herein demonstrate many of the advantages associated with the present invention. In particular, it has been revealed that a method to test and burn-in bare semiconductor dice which utilizes a universal test circuit substrate and conventional wire bonding techniques provides a standardized and low cost solution to providing known good die for use on multichip modules. A multiplicity of die sizes can be tested and burned-in using a universal test circuit substrate. Furthermore, the universal test circuit substrate has an interleaving fan-out pattern of conductive traces which allows semiconductor devices with low to high pin counts to be tested on the same test circuit substrate design. By having a universal test circuit substrate design, substantial cost savings in substrate artwork can be realized by eliminating the cost of etching a new test tape for each type of semiconductor device.

Thus it is apparent that there has been provided, in accordance with the invention, a method of testing a semiconductor device on a universal test circuit substrate which overcomes the problems associated with the prior art methods. Although the invention has been described and illustrated with reference to specific embodiments thereof, it is not intended that the invention be limited to these illustrative embodiments. Those skilled in the art will recognize that variations and modifications can be made without departing from the spirit of the invention. For example, the interleaving fan-out pattern of conductive traces is not restricted by the present invention. The pitch or spacing between each individual conductive trace may be dependent upon the technological capability of the manufacturer of the universal test circuit substrate. Furthermore, the universal test circuit substrate any be constructed with more than one conductor plane to provide a controlled impedance structure or other circuit enhancements. In addition, the present invention is not limited to any specific type of semiconductor device. The universal test circuit substrate may be used in conjunction with any semiconductor device requiring test and/or burn-in. Furthermore, once a semiconductor die is tested and burned-in, the known good die can be placed into a multiple chip module, another suitable package configuration, or the die can be directly mounted to a board, depending on the end user's requirements. Additionally, if the tested die is mounted onto a substrate in an inverted mode, an underfill material could be used to couple the die to the substrate to prevent wire shorts, to improve thermal coupling to the substrate, and to improve reliability. Thus it is intended to encompass within the invention all such variations and modifications falling within the scope of the appended claims.

I claim:

1. A method for testing a semiconductor device comprising the steps of:
   providing a universal test circuit substrate comprising:
      an insulating film of electrically nonconductive material having a surface; and
      first and second interleaving fan-out patterns of conductive traces extending radially outward on the surface of the insulating layer, wherein the first and second interleaving fan-out patterns of conductive traces initiate from different predetermined distances from a central die accommodating region and terminate in a plurality of test pads in an offset pattern around a distal periphery of the central die accommodating region, wherein said test pads are sufficiently large to enable electrical contact to test contactors;
   placing a semiconductor die in the central die accommodating region;
   wire bonding the semiconductor die to some the conductive traces to provide electrical connections; and
   testing the semiconductor die via the plurality of test pads prior to excising the semiconductor die from the universal test circuit substrate.

2. The method of claim 1, wherein the step of placing the semiconductor die comprises mounting the semiconductor die on the central die accommodating region of the universal test circuit substrate using an electrically insulating adhesive.

3. The method of claim 1, further comprising the step of:
   forming a die cavity in the universal test circuit substrate in the central die accommodating region, the die cavity having a size substantially equal to a size of the semiconductor die plus a clearance.

4. The method of claim 1, wherein the step of wire bonding comprises a technique selected from a group of: thermosonic wire bonding, ultrasonic wire bonding, and thermocompression wire bonding.

5. The method of claim 1 further comprising the step of:
   burning-in the semiconductor die via the plurality of test pads.

6. The method of claim 1, wherein the step of providing a universal test circuit substrate comprises providing a material selected from a group consisting of: conductor patterned polymer film, aluminum on polyester film, copper on polyester film, aluminum on polyimide film, copper on polyimide film, conductor patterned reinforced polymer film, copper on epoxy-glass, aluminum on epoxy-glass, copper on phenolic-paper, aluminum on phenolic paper, copper on polyimide-glass, and aluminum on polyimide-glass.

7. The method of claim 1, wherein the step of providing a universal test circuit substrate comprise providing a universal test circuit substrate having a plurality of conductor planes.

8. A method for testing a semiconductor device comprising the steps of:
   providing a universal test circuit substrate comprising:
      an insulating film of electrically nonconductive material having a surface;
      first and second interleaving fan-out patterns of conductive traces extending radially outward on the surface of the insulating layer, wherein the first and second interleaving fan-out patterns of conductive traces initiate from different predetermined distances from a central die accommodating region and terminate in a plurality of test pads in an offset pattern around a distal periphery of the central die accommodating region, wherein said test pads are sufficiently large to enable electrical contact to test contactors; and
      a plurality of excise regions in a central die accommodating region;
   providing a semiconductor die having a size;
   forming a die cavity in the universal test circuit substrate corresponding to one of the plurality of excise regions in the central die accommodating region, the die cavity being of a size substantially equal to the size of the semiconductor die plus a clearance;
   wire bonding the semiconductor die to a portion of the plurality of interleaving fan-out patterns of conductive traces to provide electrical connections; and
   testing the semiconductor die via the plurality of test pads prior to excising the semiconductor die from the universal test circuit substrate.

9. The method of claim 8 wherein the step of providing a universal test circuit substrate comprises providing a material selected from a group consisting of: conductor patterned polymer film, aluminum on polyester film, copper on polyester film, aluminum on polyimide film, copper on polyimide film, conductor patterned reinforced polymer film, copper on epoxy-glass, aluminum on epoxy-glass, copper on phenolic-paper, aluminum on phenolic paper, copper on polyimide-glass, and aluminum on polyimide-glass.

10. The method of claim 8 wherein the step of forming a die cavity is performed by a using a method selected from a group consisting of:
mechanical, laser, and etching.

11. The method of claim 8, wherein the step of providing a universal test circuit substrate comprise providing a universal test circuit substrate having a plurality of conductor planes.

12. The method of claim 8 wherein the step of wire bonding comprises a technique selected from a group of: thermosonic wire bonding, ultrasonic wire bonding, and thermocompression wire bonding.

13. The method of claim 8 further comprising the step of:
burning-in the semiconductor die via the plurality of test pads.

14. A method for testing a semiconductor device comprising the steps of:
providing a universal test circuit substrate comprising:
an insulating film for electrically nonconductive material having a surface; and
first and second interleaving fan-out patterns of conductive traces extending radially outward on the surface of the insulating layer, wherein the first and second interleaving fan-out patterns of conductive traces initiate from different predetermined distances from a central die accommodating region and terminate in a plurality of test pads in an offset pattern around a distal periphery of the central die accommodating region, wherein said test pads are sufficiently large to enable electrical contact to test contactors; and
attaching a semiconductor die on the universal test circuit substrate using an electrically insulating adhesive, wherein a portion of the semiconductor die overlies the first fan-out pattern of conductive traces;
wire bonding the semiconductor die to a portion of the plurality of interleaving fan-out patterns of conductive traces to provide electrical connections; and
testing the semiconductor die via the plurality of test pads prior to excising the semiconductor die from the universal test circuit substrate.

15. The method of claim 14 wherein the step of providing a universal test circuit substrate comprises providing a material selected from a group consisting of: conductor patterned polymer film, aluminum on polyester film, copper on polyester film, aluminum on polyimide film, copper on polyimide film, conductor patterned reinforced polymer film, copper on epoxy-glass, aluminum on epoxy-glass, copper on phenolic-paper, aluminum on phenolic paper, copper on polyimide-glass, and aluminum on polyimide-glass.

16. The method of claim 14, wherein the step of providing a universal test circuit substrate comprise providing a universal test circuit substrate having a plurality of conductor planes.

17. The method of claim 14 wherein the step of wire bonding comprises a technique selected from a group of: thermosonic wire bonding, ultrasonic wire bonding, and thermocompression wire bonding.

18. The method of claim 14 further comprising the step of:
burning-in the semiconductor die via the plurality of test pads.

* * * * *